United States Patent
Shao et al.

(10) Patent No.: US 11,728,305 B2
(45) Date of Patent: Aug. 15, 2023

(54) CAPACITOR STRUCTURE INCLUDING BONDING PADS AS ELECTRODES AND METHODS OF FORMING THE SAME

(71) Applicant: SANDISK TECHNOLOGIES LLC, Addison, TX (US)

(72) Inventors: Shiqian Shao, Fremont, CA (US); Fumiaki Toyama, Cupertino, CA (US); Peter Rabkin, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 23 days.

(21) Appl. No.: 17/317,442

(22) Filed: May 11, 2021

(65) Prior Publication Data

US 2022/0367393 A1 Nov. 17, 2022

(51) Int. Cl.
| | |
|---|---|
| *H01L 25/065* | (2023.01) |
| *H01L 23/00* | (2006.01) |
| *H01L 25/18* | (2023.01) |
| *H01L 49/02* | (2006.01) |
| *H01L 25/00* | (2006.01) |

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 28/60* (2013.01); *H01L 2224/08145* (2013.01); *H01L 2224/80895* (2013.01); *H01L 2224/80896* (2013.01); *H01L 2924/1431* (2013.01); *H01L 2924/1434* (2013.01); *H01L 2924/19041* (2013.01); *H01L 2924/19104* (2013.01)

(58) Field of Classification Search
CPC ..... H01L 24/08; H01L 24/80; H01L 25/0657; H01L 25/18; H01L 28/60; H01L 2224/08145; H01L 2224/80895; H01L 2224/80896; H01L 2924/1431; H01L 2924/1434; H01L 2924/19041
See application file for complete search history.

(56) References Cited

U.S. PATENT DOCUMENTS

| | | |
|---|---|---|
| 9,287,226 B2 | 3/2016 | Sun et al. |
| 9,589,981 B2 | 3/2017 | Nishikawa et al. |
| 9,646,981 B2 | 5/2017 | Nishikawa et al. |
| 9,876,031 B1 | 1/2018 | Shimizu et al. |
| 10,510,738 B2 | 12/2019 | Kim et al. |

(Continued)

OTHER PUBLICATIONS

U.S. Appl. No. 17/006,228, filed Aug. 28, 2020, SanDisk Technologies LLC.

(Continued)

*Primary Examiner* — Thanh Y. Tran
(74) *Attorney, Agent, or Firm* — The Marbury Law Group PLLC

(57) ABSTRACT

A semiconductor structure includes a bonded assembly of a first semiconductor die including first metal bonding pads and a second semiconductor die including second metal bonding pads, and a capacitor structure including a first electrode, a second electrode, and a node dielectric. The first electrode includes first bonded pairs of metal bonding pads. The second electrode includes second bonded pairs of metal bonding pads. The node dielectric includes portions dielectric material layers laterally surrounding the metal bonding pads.

14 Claims, 13 Drawing Sheets

(56) References Cited

U.S. PATENT DOCUMENTS

| | | | |
|---|---|---|---|
| 10,629,675 B1 | 4/2020 | Nishikawa et al. | |
| 2003/0021096 A1 | 1/2003 | Vinson et al. | |
| 2004/0075171 A1 | 4/2004 | Vinson et al. | |
| 2005/0184825 A1 | 8/2005 | Oran | |
| 2007/0065983 A1 | 3/2007 | Vinson et al. | |
| 2007/0085190 A1 | 4/2007 | Vinson et al. | |
| 2007/0090543 A1 | 4/2007 | Condie et al. | |
| 2012/0223422 A1 | 9/2012 | Sun et al. | |
| 2013/0010517 A1 | 1/2013 | Chu | |
| 2013/0272048 A1 | 10/2013 | Chu | |
| 2014/0175629 A1 | 6/2014 | Sun et al. | |
| 2016/0020235 A1* | 1/2016 | Yamashita | H01L 27/14634 250/206 |
| 2016/0277017 A1 | 9/2016 | Lin | |
| 2016/0365351 A1 | 12/2016 | Nishikawa et al. | |
| 2016/0365352 A1 | 12/2016 | Nishikawa et al. | |
| 2019/0097524 A1 | 3/2019 | Lin | |
| 2019/0221557 A1 | 7/2019 | Kim et al. | |
| 2021/0343669 A1* | 11/2021 | Jung | H01L 24/05 |

OTHER PUBLICATIONS

U.S. Appl. No. 17/006,265, filed Aug. 28, 2020, SanDisk Technologies LLC.
U.S. Appl. No. 17/244,387, filed Apr. 29, 2021, SanDisk Technologies LLC.

* cited by examiner

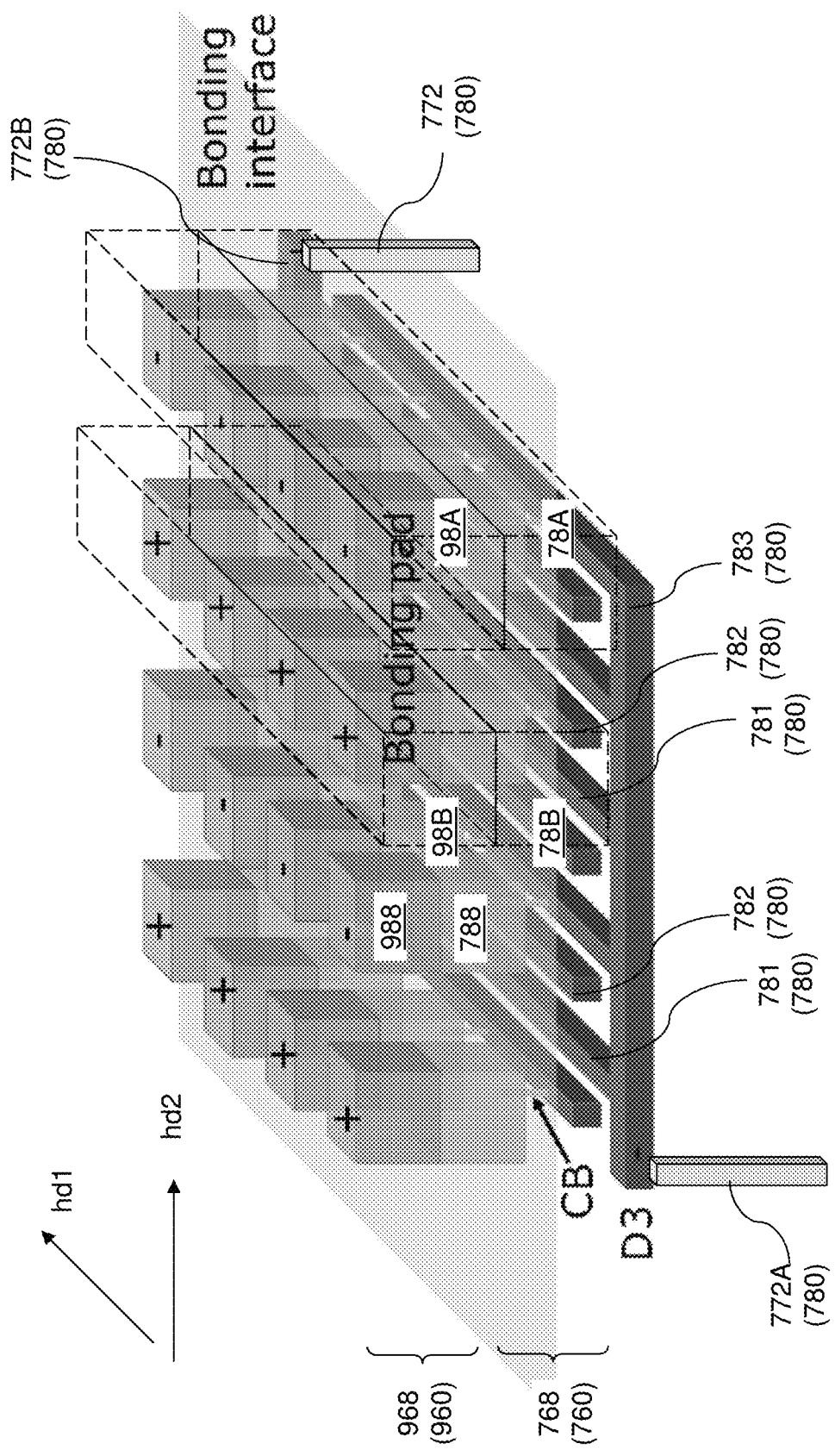

CAPACITOR STRUCTURE INCLUDING BONDING PADS AS ELECTRODES AND METHODS OF FORMING THE SAME

FIELD

The present disclosure relates generally to the field of semiconductor devices, and particularly to a semiconductor structure that contains a capacitor structure including bonded pairs of metal bonding pads as electrodes and methods for forming the same.

BACKGROUND

A pair of semiconductor dies may be bonded to each other to form a semiconductor chip. Metal-to-metal bonding may be employed to provide signal paths between the pair of semiconductor dies.

SUMMARY

According to an aspect of the present disclosure, a semiconductor structure is provided, which comprises: a bonded assembly of a first semiconductor die including first metal bonding pads and a second semiconductor die including second metal bonding pads that are bonded to the first metal bonding pads, and a capacitor structure comprising a first electrode, a second electrode, and a node dielectric disposed between the first electrode and the second electrode. The first electrode comprises first bonded pairs of a respective first metal bonding pad of a first subset of the first metal bonding pads and a respective second metal bonding pad of a first subset of the second metal bonding pads; the second electrode comprises second bonded pairs of a respective first metal bonding pad of a second subset of the first metal bonding pads and a respective second metal bonding pad of a second subset of the second metal bonding pads; and the node dielectric comprises portions of a first bonding-level dielectric layer laterally surrounding the first metal bonding pads and disposed between laterally neighboring pairs of the first metal bonding pads and portions of a second bonding-level dielectric layer laterally surrounding the second metal bonding pads and disposed between laterally neighboring pairs of the second metal bonding pads.

According to another aspect of the present disclosure, a method of forming a semiconductor structure is provided, which comprises: providing a first semiconductor die including first metal bonding pads; providing a second semiconductor die including second metal bonding pads; and bonding the second metal bonding pads to the first metal bonding pads by metal-to-metal bonding to form a capacitor structure comprising a first electrode, a second electrode, and a node dielectric disposed between the first electrode and the second electrode. The first electrode comprises first bonded pairs of a respective first metal bonding pad of the first subset of the first metal bonding pads and a respective second metal bonding pad of a first subset of the second metal bonding pads; and the second electrode comprises second bonded pairs of a respective first metal bonding pad of the second subset of the first metal bonding pads and a respective second metal bonding pad of a second subset of the second metal bonding pads.

BRIEF DESCRIPTION OF THE DRAWINGS

FIG. 3C is a third configuration of the capacitor structure according to an embodiment of the present disclosure.

DETAILED DESCRIPTION

Figure 1A:
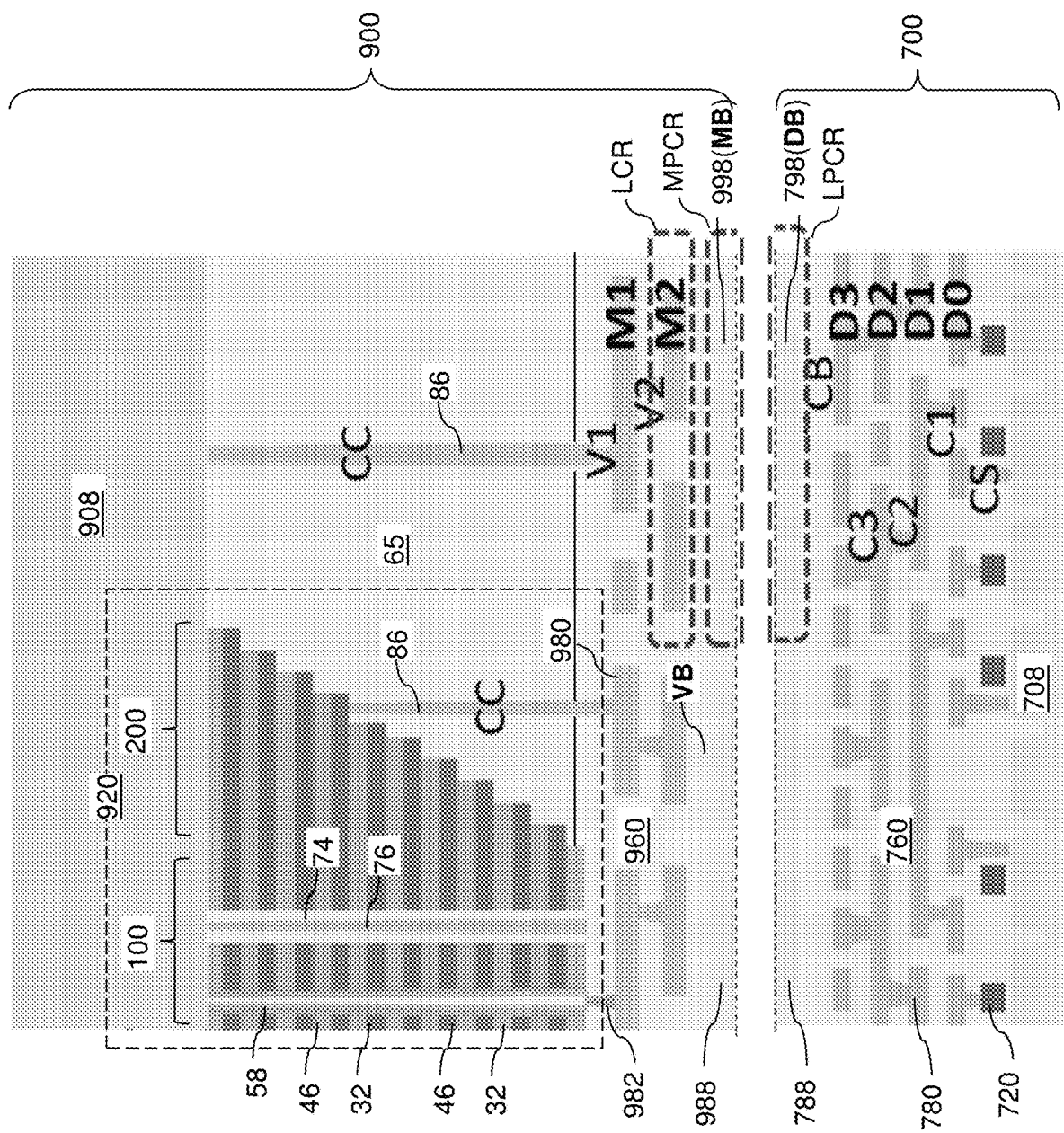
FIG. 1A is a schematic vertical cross-sectional view of an exemplary structure after aligning a first semiconductor die over a second semiconductor die for bonding according to an embodiment of the present disclosure.

As discussed above, the present disclosure is directed to a capacitor including bonded pairs of metal bonding pads as electrodes and methods for forming the same, the various aspects of which are incorporated herein by reference.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^5$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Generally, two semiconductor dies can be bonded to each other employing mating pairs of metallic bonding pads. For example, a memory die including a three-dimensional array of memory elements can be bonded to a logic die including a peripheral circuitry configured to control operation of the three-dimensional array of memory elements. A subset of the mating pairs of metallic bonding pads can be employed to provide electrical connection between the two semiconductor dies for bit lines, word lines, source power supply lines, input/output signals, etc. between the memory die and the logic die. According to an aspect of the present disclosure, an additional subset of the mating pairs of metallic bonding pads can be employed as components of a capacitor structure. The capacitor structure of the embodiment present disclosure can include metallic components that are formed in volumes that are not employed for providing electrically conductive paths between the semiconductor dies. For example, the capacitor structure may include a pair of interdigitated metal lines that is formed at a metal interconnect level within the memory die or within the logic die. Use of volumes that are not used for electrically conductive paths can increase the efficiency of area usage in the bonded assembly of the memory die and the logic die. The capacitor structure may be employed for various purposes. For example, the capacitor structure may be employed as a pool capacitor, a pump capacitor, or a sense circuit capacitor.

Figure 1B:
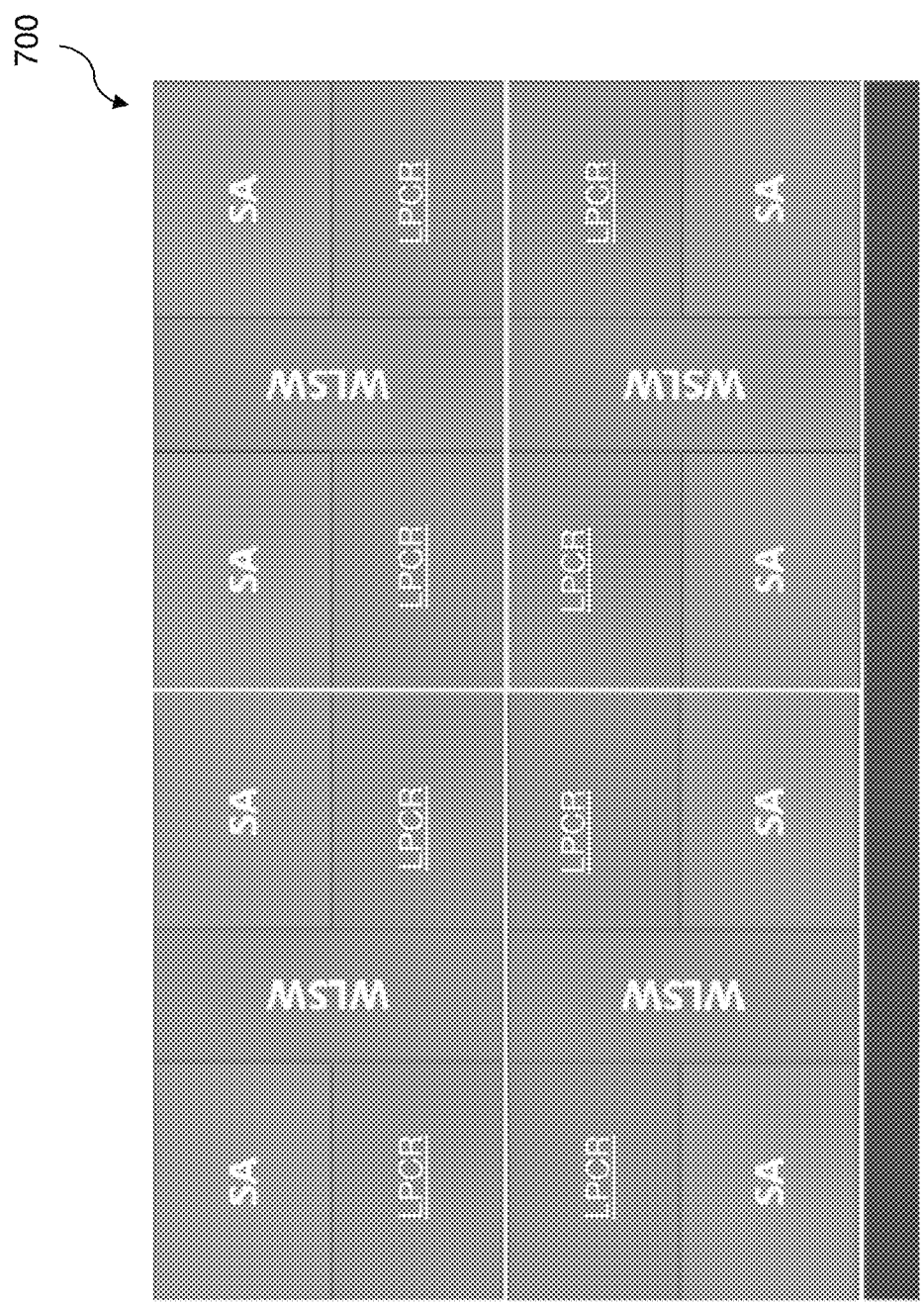
FIG. 1B is an exemplary layout of a logic die within the exemplary structure of FIG. 1A.
Figure 1C:
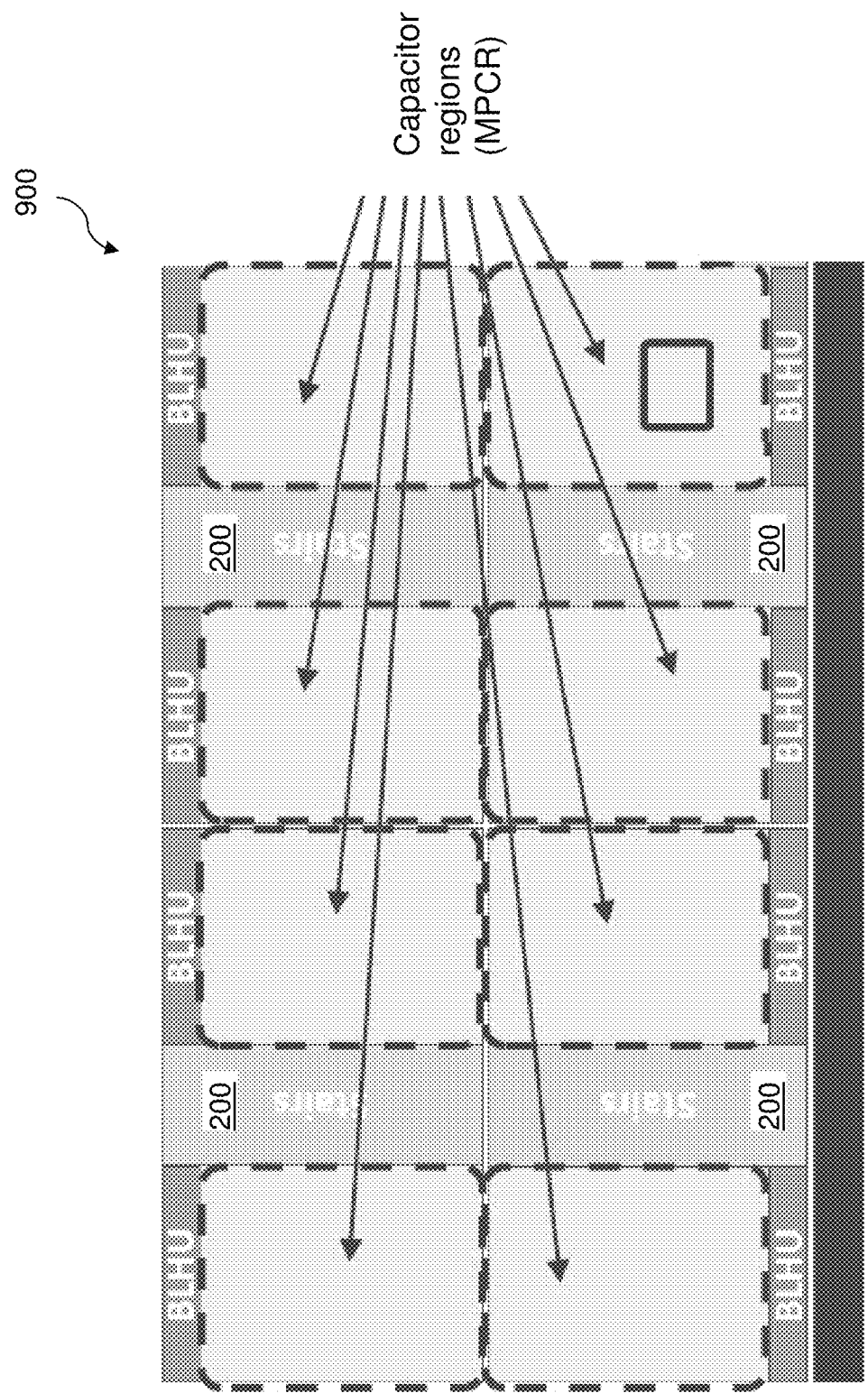
FIG. 1C is an exemplary layout of a memory die within the exemplary structure of FIG. 1A.

Referring to FIGS. 1A-1C, an exemplary structure including a first semiconductor die 900 and a second semiconductor die 700 is illustrated after aligning the first semiconductor die 900 over the second semiconductor die 700 for bonding. FIG. 1A is a vertical cross-sectional view of the exemplary structure, FIG. 1B is a plan view of the second semiconductor die 700 which may be a logic die, and FIG. 1C is a plan view of the first semiconductor die 900, which may be a memory die.

Generally, the first semiconductor die 900 includes first semiconductor devices 920 located on a first semiconductor substrate 908 (which may be a memory-side semiconductor substrate in case the first semiconductor die 900 is a memory die), and first metal bonding pads 988 located on a bonding side of the first semiconductor die 900. The second semiconductor die 700 includes second semiconductor devices 720 located on a second semiconductor substrate 708 (which may be a logic-side semiconductor substrate in case the second semiconductor die is a logic die) and second metal bonding pads 788 located on a bonding side of the second semiconductor die 700.

The first semiconductor die 900 and the second semiconductor die 700 can be a pair of semiconductor dies that can provide complementary functionalities. In one embodiment, one of the first semiconductor die 900 and the second semiconductor die 700 comprises a memory die including a three-dimensional array of memory elements, and another of the first semiconductor die 900 and the second semiconductor die 700 comprises a logic die including a peripheral circuitry configured to control operation of the three-dimensional array of memory elements. In the illustrated example, the first semiconductor die 900 may be a memory die including a three-dimensional array of memory elements, and the second semiconductor die 700 may be a logic die including a peripheral circuitry configured to control operation of the three-dimensional array of memory elements.

In one embodiment, the first semiconductor devices 920 may include an alternating stack of insulating layers 32 and electrically conductive layers (e.g., word lines and select gate electrodes) 46 including a two-dimensional array of memory openings. Each memory opening may be filled within a respective memory opening fill structure 58 that includes a respective vertical stack of memory elements. In one embodiment, the memory elements may be located at levels of the electrically conductive layers 46. The memory elements may comprise a charge storage material, a ferroelectric material, a phase change material, or any other memory material that can store a data bit through at least two different material states. In one embodiment, each memory opening fill structure 58 includes a vertical semiconductor channel and a memory film that includes a respective stack of memory elements. In one embodiment, the memory film may comprise a layer stack of a blocking dielectric layer, a charge storage material layer, and a tunneling dielectric layer. In one embodiment, source regions (not illustrated) may be provided within surface portions of the first semiconductor substrate 908 that contacts the alternating stack (32, 46). In one embodiment, a plurality of alternating stacks (32, 46) can be formed over the first semiconductor substrate 908, and can be laterally spaced apart by backside trenches, which may be filled with a respective backside trench fill structure (74, 76). In an illustrative example, each backside trench fill structure (74, 76) may comprise an insulating spacer 74 and a backside contact via structure 76.

Each of the alternating stacks (32, 46) may comprise stepped surfaces. The lateral extent of the electrically conductive layers 46 may decrease with a vertical distance from the first semiconductor substrate 908 within each staircase region in which the stepped surfaces are present. A stepped dielectric material portion 65 can be formed over the stepped surfaces of the alternating stacks (32, 45), for example, by deposition and planarization of a dielectric material such as silicon oxide. Contact via structures 86 (which are labeled as "CC" in FIG. 1A) can be formed through the stepped dielectric material portion 65 on the stepped surfaces of the electrically conductive layers 46 and optionally on the first semiconductor substrate 908.

First dielectric material layers 960 (which may be memory-side dielectric material layers) embedding first metal interconnect structures 980 (which may be memory-side metal interconnect structures) can be formed over the alternating stacks (32, 46) and the three-dimensional array of memory elements. The first dielectric material layers 960 may include various via-level dielectric material layers, various line-level dielectric material layers, and a first pad-level dielectric material layer (which is a topmost layer among of the first dielectric material layers 960 prior to flipping the first semiconductor die 900 upside down). First metal bonding pads 988 can be formed within the first pad-level dielectric material layer.

In an illustrative example, the first metal interconnect structures 980 may include memory-side first via structures V1, memory-side first line structures M1, memory-side second via structures V2, memory-side second line structures M2, and memory-side pad-connection via structures VB. The memory-side first line structures M1 include bit lines 982 for the three-dimensional array of memory elements in the first semiconductor devices 920. Further, a subset of the memory-side first line structures M1 may be electrically connected to the electrically conductive layers 46, which may function as word lines for the three-dimensional array of memory elements. The memory-side pad-connection via structures VB may be connected to a respective one of the first metal bonding pads 988 (which are also referred to as "MB pads").

In one embodiment, the second semiconductor devices 720 in the second semiconductor die 700 may include a peripheral circuit configured to control operation of the three-dimensional array of memory elements in the first semiconductor die 900. For example, the peripheral circuit may comprise field effect transistors and other semiconductor devices known in the art, such as resistors, capacitors, diodes, etc. In one embodiment, the second semiconductor substrate 708 may include a single crystalline semiconductor layer (such as a single crystalline silicon layer) that contains channels of the various field effect transistors.

Second dielectric material layers 760 (which may be logic-side dielectric material layers) embedding second metal interconnect structures 780 (which may be logic-side metal interconnect structures) can be formed over second semiconductor devices 720. The second dielectric material layers 760 may include various via-level dielectric material layers, various line-level dielectric material layers, and a second pad-level dielectric material layer (which is a topmost layer among of the second dielectric material layers 760). Second metal bonding pads 788 can be formed within the second pad-level dielectric material layer.

In an illustrative example, the second metal interconnect structures 780 may include logic-side contact via structures (e.g., transistor source and drain electrodes) CS, logic-side base line structures D0, logic-side first via structures C1, logic-side first line structures D1, logic-side second via structures C2, logic-side second line structures D2, logic-side third via structures C3, logic-side third line structures D3, and logic-side pad-connection via structures CB. The logic-side pad-connection via structures CB may be connected to a respective one of the second metal bonding pads 788 (which are labeled as "DB pads" in FIG. 1A).

According to an aspect of the present disclosure, the first semiconductor die 900 comprises a first subset of the first metal bonding pads 988, which can be arranged in first rows that laterally extend along a first horizontal direction and can be electrically connected to first metal lines (such as a first subset of the memory-side second line structures M2) that underlie the first subset of the memory-side second line structures M2 (prior to flipping the first semiconductor die 900 upside down). A single first metal line structure M2 can electrically connect plural first metal bonding pads 988 of a first subset in a first row to each other. The first semiconductor die 900 further comprises a second subset of the first metal bonding pads 988, which can be arranged in second rows that laterally extend along the first horizontal direction, can be electrically connected to second metal lines (such as a second subset of the memory-side second line structures M2) that underlie the second subset of the memory-side second line structures M2 (prior to flipping the first semiconductor die 900 upside down), and can be interlaced with the first rows such that the first rows and the second rows alternate along a second horizontal direction hd2 that is perpendicular to the first horizontal direction hd1. A single second metal line structure M2 can electrically connect plural first metal bonding pads 988 of a second subset in a second row to each other. The first subset and the second subset of the first metal bonding pads 988 can be located within a memory-side pad capacitor region MPCR. The first metal lines and the second metal lines (which are subset of the memory-side second line structures M2) can be located within a line-level capacitor region LCR.

In one embodiment, the second semiconductor die 700 may comprise a first subset of the second metal bonding pads 788 that are arranged in a mirror image pattern of the pattern of the first subset of the first metal bonding pads 988, and a second subset of the second metal bonding pads 788 that are arranged in a mirror image pattern of the pattern of the second subset of the first metal bonding pads 988. The second metal bonding pads 788 within the first subset of the second metal bonding pads 788 can be electrically isolated from each other. The second metal bonding pads 788 within the second subset of the second metal bonding pads 788 can be electrically isolated from each other. The first subset of the second metal bonding pads 788 and the second subset of the second metal bonding pads 788 can be located within a logic-side pad capacitor region LPCR.

The first subset of the first metal bonding pads 988 and the first metal lines (such as the first subset of the memory-side second line structures M2) constitute components a first electrode (e.g., positive electrode) of a capacitor structure to be subsequently formed, and can be electrically connected to a first node of the first semiconductor devices 920 in the first semiconductor die 900. The second subset of the first metal bonding pads 988 and the second metal lines (such as the second subset of the memory-side second line structures M2) constitute components a second electrode (e.g., negative electrode) of the capacitor structure to be subsequently formed, and can be electrically connected to a second node of the first semiconductor devices 920 in the first semiconductor die 900. A subset of the second metal bonding pads 788 to be subsequently bonded with a respective first metal bonding pad 988 within the first subset or the second subset of the first metal bonding pads 988 can be electrically isolated from each other and can be electrically isolated from the second semiconductor devices 720 prior to bonding the second metal bonding pads 788 to the first metal bonding pads 988.

The first metal bonding pads 988 may comprise a third subset of the first metal bonding pads 988 that are located outside the memory-side pad capacitor region MPCR. The second metal bonding pads 788 may comprise a third subset of the second metal bonding pads 788 that are located outside the logic-side pad capacitor region LPCR. The third subset of the first metal bonding pads 988 and the third subset of the second metal bonding pads 788 can be configured to mate with each other during a subsequent bonding process, and can provide signal paths for transmitting electrical signals and/or power supply voltages across the first semiconductor die 900 and the second semiconductor die 700 upon bonding the first semiconductor die 900 to the second semiconductor die 700.

In one embodiment, the memory die (which may comprise the first semiconductor die 900) can include at least one memory array region 100 in which each layer of an alternating stack of insulating layers 32 and electrically conductive layers 46 is present and in which memory opening fill structures 58 are present. Further, the memory die can comprise at least one staircase region 200 in which stairs composed of stepped surfaces of the alternating stacks (32, 46) are present. The staircase regions 200 can be employed as word line hookup (WLHU) regions in which in which electrical connections between the electrically conductive layers 46 and a respective first metal bonding pad 988 within the third subset of the first metal bonding pads 988 are provided. The memory die can comprise bit line hookup (BLHU) regions in which electrical connections between bit lines 982 and a respective first metal bonding pad 988 within the third subset of the first metal bonding pads 988 are provided. A predominant portion (e.g., greater than 50% of the area) of the memory array region 100 may be free of the third subset of the first metal bonding pads 988, and can be employed to accommodate the memory-side pad capacitor region MPCR and the line-level capacitor region LCR, which are collectively referred to as capacitor regions.

In one embodiment, the logic die (which may comprise the second semiconductor die 700) can include sense amplifier regions (SA) including sense amplifiers that are electrically connected to the bit lines 982 in the memory die 900 upon subsequently bonding the logic die to the memory die. Further, the logic die can include word line switch region (WLSW) including word line drivers that are electrically connected to a respective one of the electrically conductive layers 46 upon subsequently bonding the logic die to the memory die.

Figure 3A:
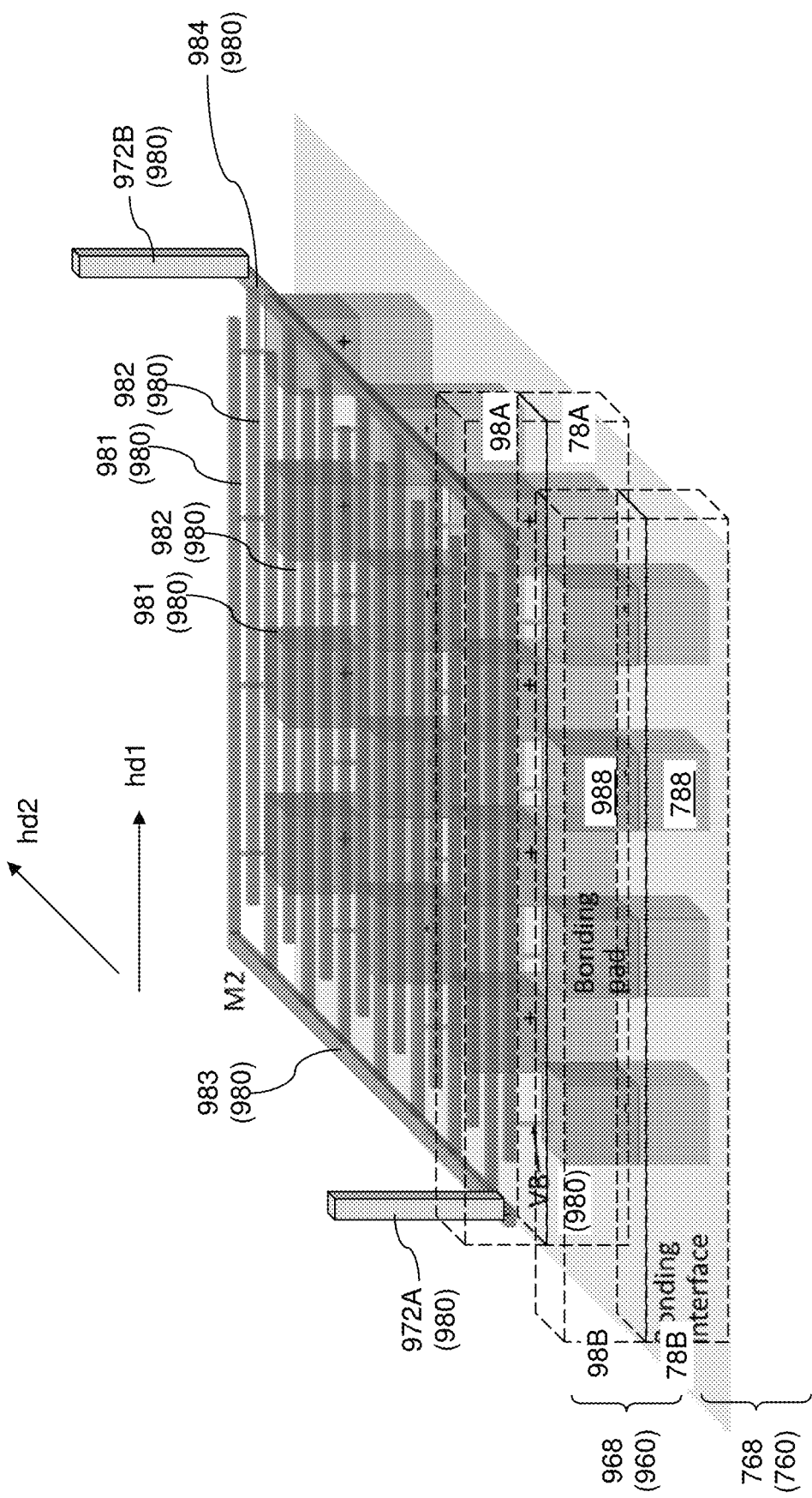
FIG. 3A is a first configuration of a capacitor structure according to an embodiment of the present disclosure.
Figure 3B:
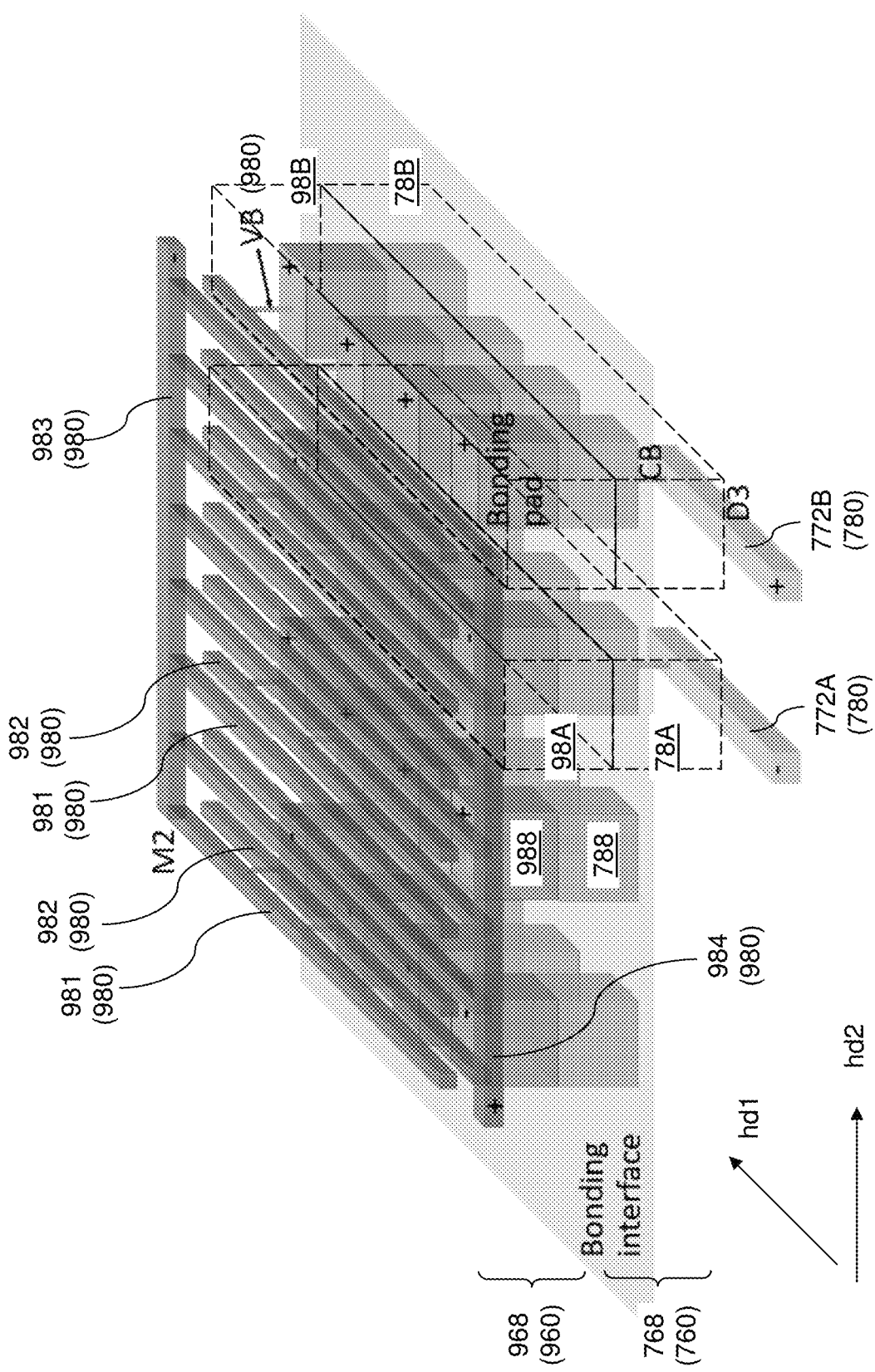
FIG. 3B is a second configuration of the capacitor structure according to an embodiment of the present disclosure.

While the exemplary structure illustrated in FIGS. 1A-1C includes the capacitor regions within the memory die (which may comprise the first semiconductor die 900), the capacitor regions may be formed within the logic die in an alternative configuration shown in FIGS. 3B and 3C. In this alternative configuration, the second semiconductor die 700 comprises a first subset of the second metal bonding pads 788, which can be arranged in first rows that laterally extend along a first horizontal direction and can be electrically connected to the first metal lines (such as a first subset of the logic-side third line structures D3) that underlie the first subset. The second semiconductor die 700 further comprises a second subset of the second metal bonding pads 788, which can be arranged in second rows that laterally extend along the first horizontal direction, can be electrically connected to second metal lines (such as a second subset of the logic-side third line structures D3) that underlie the second subset, and can be interlaced with the first rows such that the first rows and the second rows alternate along a second horizontal direction that is perpendicular to the first horizontal direction. The first subset and the second subset of the second metal bonding pads 788 can be located within a logic-side pad capacitor region LPCR. The first metal lines and the second metal lines (which are subset of the logic-side third line structures D3) can be located within a line-level capacitor region that is located underneath the logic-side pad capacitor region LPCR.

In the alternative configuration, the first semiconductor die 900 may comprise a first subset of the first metal bonding pads 988 that are arranged in a mirror image pattern of the pattern of the first subset of the second metal bonding pads 788, and a second subset of the first metal bonding pads 988 that are arranged in a mirror image pattern of the pattern of the second subset of the second metal bonding pads 788. The first metal bonding pads 988 within the first subset of the first metal bonding pads 988 can be electrically isolated from each other. The first metal bonding pads 988 within the second subset of the first metal bonding pads 988 can be electrically isolated from each other. The first subset of the first metal bonding pads 988 and the second subset of the first metal bonding pads 988 can be located within a memory-side pad capacitor region MPCR.

Figure 2:
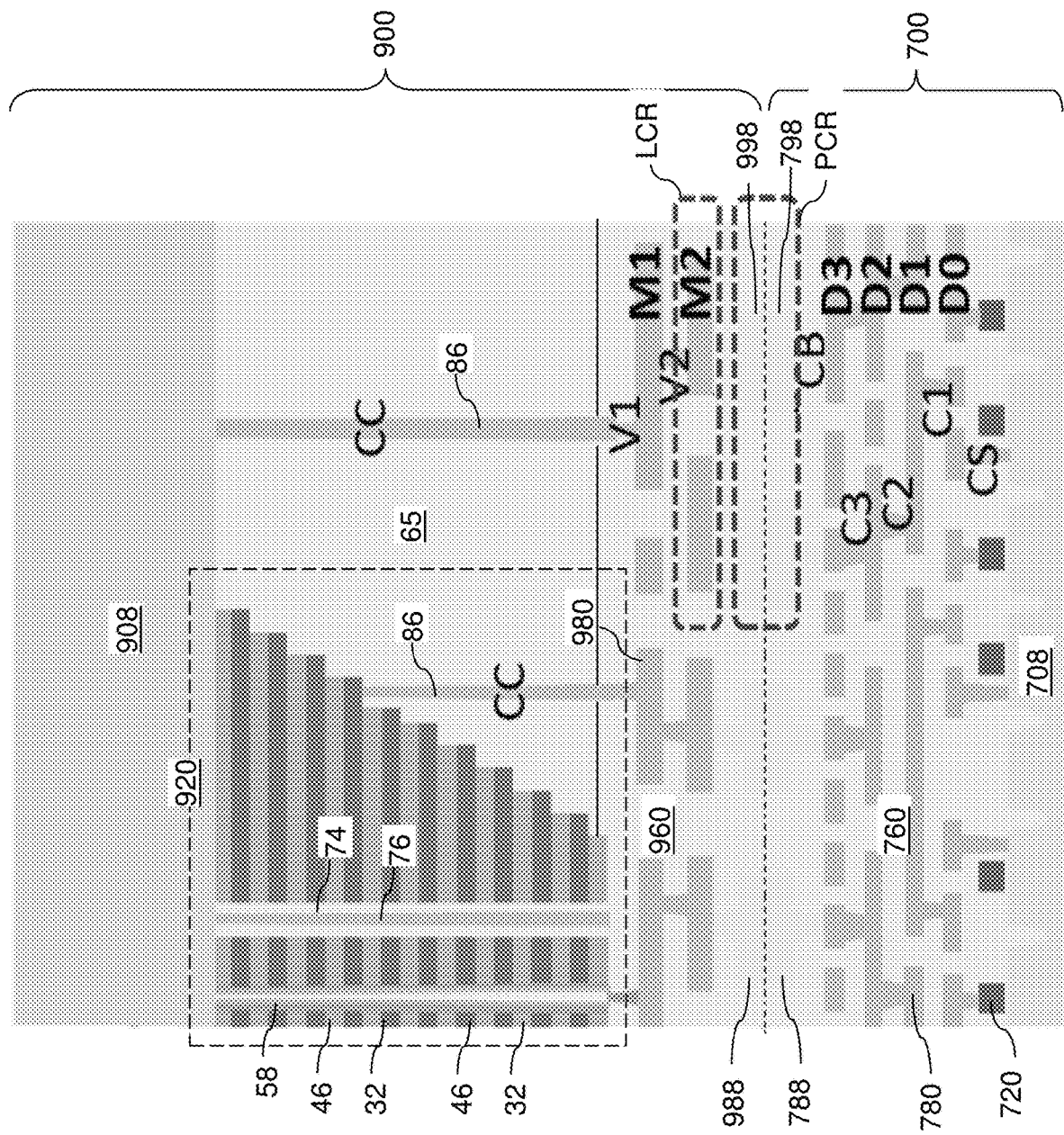
FIG. 2 is a schematic vertical cross-sectional view of the exemplary structure after bonding the first semiconductor die and the second semiconductor die according to an embodiment of the present disclosure.

Referring to FIG. 2, the first semiconductor die 900 and the second semiconductor die 700 can be brought into contact with each other such that each first metal bonding pad 988 contacts a respective one of the second metal bonding pads 788. A thermal anneal process can be performed to induce metal-to-metal bonding between each mating pair of a first metal bonding pad 988 and a second metal bonding pad 788. In an illustrative example, if each of the first metal bonding pad 988 and a second metal bonding pad 788 comprises copper at an atomic percentage greater than 90% (such as greater than 95% and/or greater than 98%), then thermal anneal may be performed at an elevated temperature in a range from 300 degrees Celsius to 400 degrees Celsius, although lower and higher anneal temperatures may also be employed. The third subset of the first metal bonding pads 988 and the third subset of the second metal bonding pads 788 are bonded to each other to provide various electrically conductive paths between the first semiconductor devices 920 and the second semiconductor devices 720.

In one embodiment, the first metal bonding pads 988 and the second metal bonding pads 788 comprise a metal element (such as copper) at an atomic percentage greater than 90%, and/or greater than 95%, and/or greater than 98%. During the metal-to-metal bonding, the metal element inter- diffuses through bonding interfaces located between a respective one of the first metal bonding pads 988 and a respective one of the second metal bonding pads 788. This may result in grain boundaries which protrude upward or downward through the bonding interfaces. In other words, the bonding interfaces between mating pairs of a first metal bonding pad 988 and a second metal bonding pad 788 may comprise microscopic protrusions and microscopic depressions from a horizontal plane located at an average height of the bonding interfaces.

The combination of the memory-side pad capacitor region MPCR and the logic-side pad capacitor region LPCR is collectively referred to as a pad capacitor region PCR. According to an aspect of the present disclosure, a capacitor structure comprising a first electrode, a second electrode, and a node dielectric disposed between the first electrode and the second electrode can be formed upon bonding the second metal bonding pads 798 to the first metal bonding pads 998 by metal-to-metal bonding. The capacitor structure can be formed within volumes of the pad capacitor region PCR and optionally in adjacent volumes within the first semiconductor die 900 (such as the line-level capacitor region LCR) or in adjacent volumes within the second semiconductor die 700. The capacitor structure of the embodiments of the present disclosure can be formed in many different configurations, examples of which are expressly illustrated in FIGS. 3A, 3B, and 3C.

Referring collectively to FIGS. 3A, 3B, and 3C, the first electrode comprises first bonded pairs of a respective first metal bonding pad 988 of a first subset 98A of the first metal bonding pads 988 and a respective second metal bonding pad 788 of a first subset 78A of the second metal bonding pads 788. The second electrode comprises second bonded pairs of a respective first metal bonding pad 988 of a second subset 98B of the first metal bonding pads 988 and a respective second metal bonding pad 788 of a second subset 78B of the second metal bonding pads 788. The node dielectric comprises portions of a first bonding-level dielectric layer 968 (which is a first dielectric material layer 960 contacting a bonding interface) laterally surrounding the first metal bonding pads 988 and disposed between laterally neighboring pairs of the first metal bonding pads 988 in the first semiconductor die 900 and portions of a second bonding-level dielectric layer 768 (which is a second dielectric material layer 760 contacting the bonding interface) laterally surrounding the second metal bonding pads and disposed between laterally neighboring pairs of the second metal bonding pads in the second semiconductor die 700.

In one embodiment, the first semiconductor die 900 comprises the first semiconductor devices 920 located on the first semiconductor substrate 908. The first electrode is electrically connected to a first node of the first semiconductor devices 920 and the second electrode is electrically connected to a second node of the first semiconductor devices 920 as illustrated in FIG. 3A. For example, a first subset 972A of the first metal interconnect structures 980 can provide a first electrically conductive path between the first electrode and the first node of the first semiconductor devices 920, and a second subset 972B of the first metal interconnect structures 980 can provide a second electrically conductive path between the second electrode and the second node of the first semiconductor devices 920.

In one embodiment, the second semiconductor die 700 comprises second semiconductor devices 720 located on the second semiconductor substrate 708. A first subset 78A and a second subset 78B of the second metal bonding pads 788 are electrically isolated from each other and are electrically isolated from the second semiconductor devices 720 prior to bonding the second metal bonding pads 788 to the first metal bonding pads 988. Upon bonding the second metal bonding pads 788 to the first metal bonding pads 988, the first subset 78A of the second metal bonding pads 788 is incorporated into the first electrode of the capacitor structure, and the second subset 78B of the second metal bonding pads 788 is incorporated into the second electrode of the capacitor structure.

Referring back to FIG. 2, first metal bonding pads 988 located outside the volumes of the pad capacitor region PCR comprise a third subset of the first metal bonding pads 988, which is electrically isolated from the capacitor structure and is electrically connected to a respective node of first semiconductor devices 920 located in the first semiconductor die 900. Second metal bonding pads 788 located outside the volumes of the pad capacitor region PCR comprise a third subset of the second metal bonding pads 788, which is electrically isolated from the capacitor structure and is electrically connected to a respective node of second semiconductor devices 720 located in the second semiconductor die 700. The third subset of the second metal bonding pads 788 is bonded to the third subset of the first metal bonding pads 988 to provide electrically conductive paths. Generally, upon bonding the second metal bonding pads 788 to the first metal bonding pads 988, third bonded pairs of a respective first metal bonding pad 988 of the third subset of the first metal bonding pads 988 and a respective second metal bonding pad 788 of the third subset of the second metal bonding pads 788 are formed. In one embodiment, the third bonded pairs provide electrically conductive paths between the three-dimensional array of memory elements and the peripheral circuitry.

Referring to FIGS. 3A, 3B, and 3C, the first bonded pairs of a respective first metal bonding pads 988 and a respective second metal bonding pads 788 can be arranged as first rows of bonded pairs of a respective first metal bonding pad 988 within the first subset 98A of the first metal bonding pads 988 and a respective second metal bonding pad 788 within the first subset 78A of the second metal bonding pads 788. The second bonded pairs of a respective the first metal bonding pads 988 and a respective second metal bonding pads 788 can be arranged as second rows of bonded pairs of a respective first metal bonding pad 988 within the second subset 98B of the first metal bonding pads 988 and a respective second metal bonding pad 788 within the second subset 78B of the second metal bonding pads 788.

In one embodiment, each of the first rows of bonded pairs laterally extends along a first horizontal direction hd1, and each of the second rows of bonded pairs laterally extends along the first horizontal direction hd1. In one embodiment, the first rows of bonded pairs and the second rows of bonded pairs are interlaced along a second horizontal direction hd2 that is perpendicular to the first horizontal direction hd1 such that the first rows and the second rows alternate along the second horizontal direction hd2. In this case, a sequence of a first row, a second row, a first row, a second row, a first row, a second row, etc. can be formed along the second horizontal direction hd2.

According to another embodiment of the present disclosure, the first electrode comprises first metal lines (981 or 781) embedded within a first one of the first semiconductor die 900 and the second semiconductor die 700 and electrically connected to the first bonded pairs of the first subset 98A of the first metal bonding pads 988 and the first subset 78A of the second metal bonding pads 788. The second electrode comprises second metal lines (982 or 782) embedded within the first one of the first semiconductor die 900 and the second semiconductor die 700 and electrically connected to the second bonded pairs of the second subset 98B of the first metal bonding pads 988 and the second subset 78B of the second metal bonding pads 788. The first metal lines (981 or 781) laterally extend along the first horizontal direction hd1, and the second metal lines (982 or 782) laterally extend along the first horizontal direction hd1. The first metal lines (981 or 781) and the second metal lines (982 or 782) are interlaced along a second horizontal direction hd2 that is perpendicular to the first horizontal direction hd1 such that the first metal lines (981 or 781) and the second metal lines (982 or 782) alternate along the second horizontal direction hd2.

In one embodiment, the first semiconductor die 900 comprises a memory die containing a three-dimensional array of memory elements, and the second semiconductor die 700 comprises a logic die containing a peripheral circuit configured to control operation of the three-dimensional array of memory elements.

In one embodiment, the first one of the first semiconductor die 900 and the second semiconductor die 700 (which contains the first metal lines (981 or 781) and the second metal lines (982, 782)) comprises the memory die, and the memory die comprises bit lines 982 located between the three-dimensional array of memory elements and a horizontal plane including bonding interfaces between the first semiconductor die 900 and the second semiconductor die 700. The first metal lines (981 or 781) and the second metal lines (982 or 782) are more proximal to the horizontal plane including the bonding interfaces than the bit lines 982 are to the horizontal plane.

In another embodiment, the first one of the first semiconductor die 900 and the second semiconductor die 700 (which contains the first metal lines (981 or 781) and the second metal lines (982, 782)) comprises the logic die, and the logic die comprises field effect transistors located on a surface of a logic-side semiconductor substrate (such as the second semiconductor substrate 708). The first metal lines (981 or 781) and the second metal lines (982 or 782) are more proximal to a horizontal plane including bonding interfaces between the first semiconductor die 900 and the second semiconductor die 700 than the field effect transistors are to the bonding interface.

In one embodiment, the first metal lines (981 or 781) laterally extend along a first horizontal direction hd1, and the second metal lines (982 or 782) laterally extend along the first horizontal direction hd1. The first metal lines (981 or 781) and the second metal lines (982 or 782) are interlaced along a second horizontal direction hd2 that is perpendicular to the first horizontal direction hd1 such that the first metal lines (981 or 781) and the second metal lines (982 or 782) alternate along the second horizontal direction hd2.

In one embodiment, the first electrode further comprises a first bus metal line (983 or 783) laterally extending along the second horizontal direction hd2, and each of the first metal lines (981 or 781) comprises a respective end portion connected to the first bus metal line (983 or 783). The second electrode further comprises a second bus metal line (984 or 784) laterally extending along the second horizontal direction hd2, and each of the second metal lines (982 or 782) comprises a respective end portion connected to the second bus metal line (984 or 784).

In one embodiment, metal interconnect structures (such as first metal interconnect structures 980 or second metal interconnect structures 780) are located within a first one of the first semiconductor die 900 and the second semiconductor die 700. The metal interconnect structures can comprise a first electrically conductive path (972A or 772A) that electrically connects the first electrode to a first node of semiconductor devices (920 or 720) located within the first one of the first semiconductor die 900 and the second semiconductor die 700, and a second electrically conductive path (972B or 772B) that electrically connects the second electrode to a second node of the semiconductor devices (920 or 720) located within the first one of the first semiconductor die 900 and the second semiconductor die 700.

In one embodiment, the first electrode and the second electrode do not contact any metal interconnect structure (780 or 980) embedded within a second one of the first semiconductor die 900 and the second semiconductor die 700. In one embodiment, the first one of the first semiconductor die 900 and the second semiconductor die 700 can be the first semiconductor die 900, and the second one of the first semiconductor die 900 and the second semiconductor die 700 can be the second semiconductor die 700. Alternatively, the first one of the first semiconductor die 900 and the second semiconductor die 700 can be the second semiconductor die 700, and the second one of the first semiconductor die 900 and the second semiconductor die 700 can be the first semiconductor die 900.

In one embodiment, the first subset 98A of the first metal bonding pads 988, the first subset 78A of the second metal bonding pads 788, the second subset 98B of the first metal bonding pads 988, and the second subset 78B of the second metal bonding pads 788 comprise respective rows of metal bonding pads having a periodic pitch along a first horizontal direction hd1 and having a nearest-neighbor spacing within each row that is less than one half of the periodic pitch along the first horizontal direction hd1. In one embodiment, the periodic pitch may be in a range from 1,000 nm to 10,000 nm.

Figure 4:
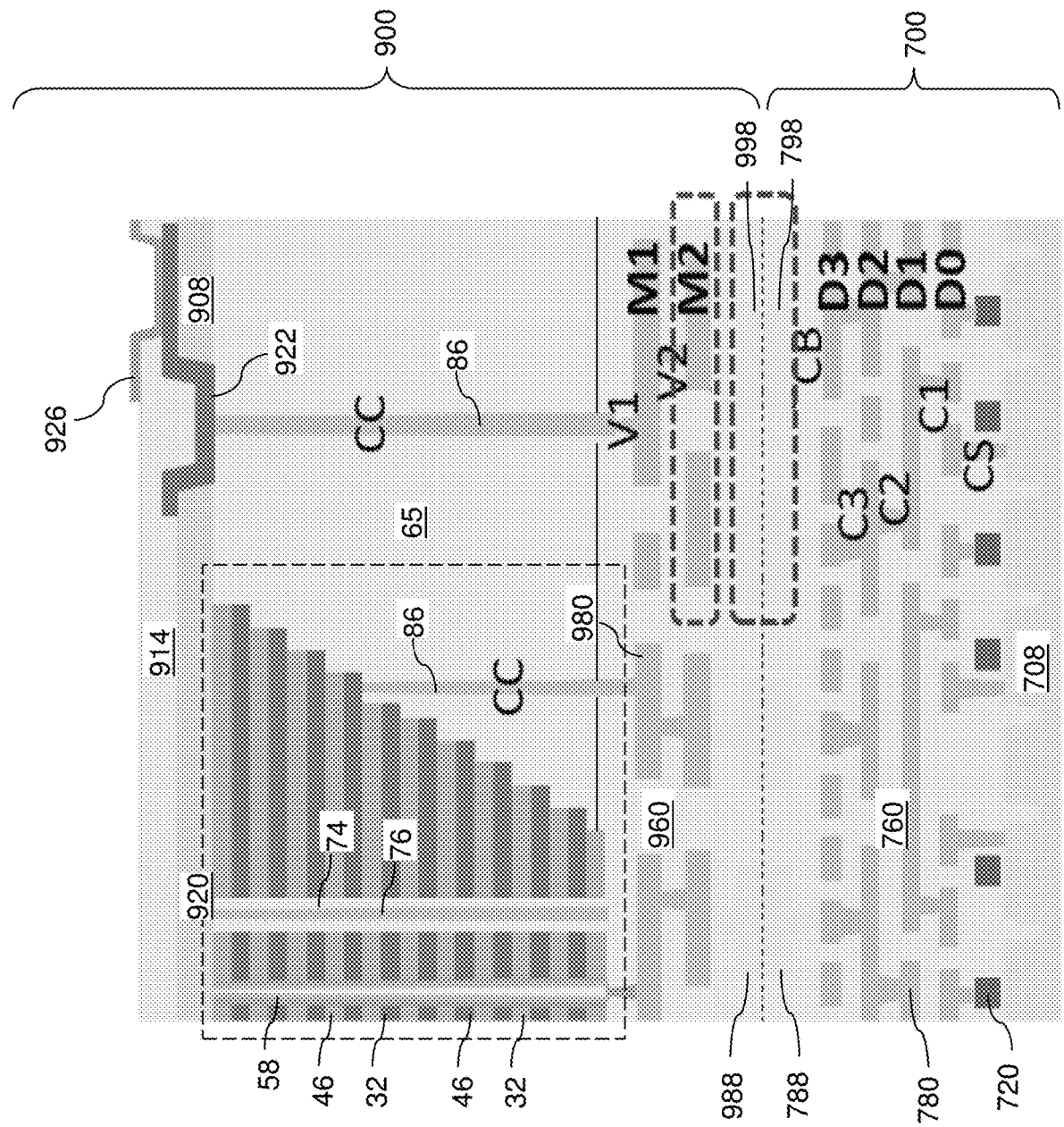
FIG. 4 is a schematic vertical cross-sectional view of the exemplary structure after formation of a backside insulating layer and external bonding pads according to an embodiment of the present disclosure.

Referring to FIG. 4, the backside of one of the first semiconductor substrate 908 and the second semiconductor substrate 708 may be thinned from the backside. For example, the first semiconductor substrate 908 or the second semiconductor substrate 708 may be thinned from the backside by grinding, polishing, an anisotropic etch process, and/or an isotropic etch process. Openings can be formed through the thinned semiconductor substrate (908 or 708), and electrical connection structures 922 may be formed through the openings directly on a respective conductive structure (e.g., contact via structures 86 or metal interconnect structures). A backside insulating layer 914 can be formed over the electrical connection structures 922. External bonding pads 926 can be formed on the electrical connection structures 922. Generally, a backside insulating layer 914 can be located on a backside of one of the first semiconductor substrate 908 and the second semiconductor substrate 708. The external bonding pads 926 can be located on the backside insulating layer 914, and can be electrically connected to a respective one of the first semiconductor devices 920 and the second semiconductor devices 720.

Figure 5A:
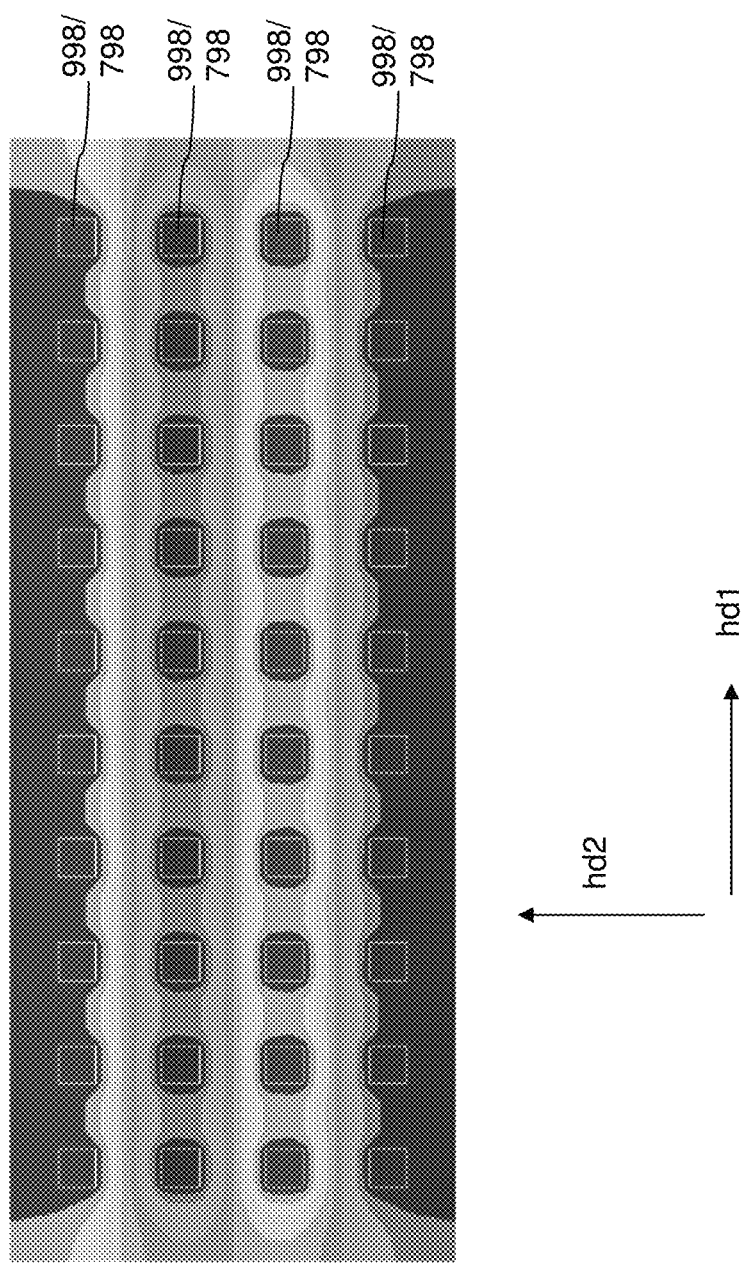
FIG. 5A is a simulated horizontal cross-sectional profile of equipotential lines within a horizontal plane including the bonded pairs of first metal bonding pads and second metal bonding pads when a bias voltage is applied across the first electrode and the second electrode of the capacitor structure of an embodiment of the present disclosure.
Figure 5B:
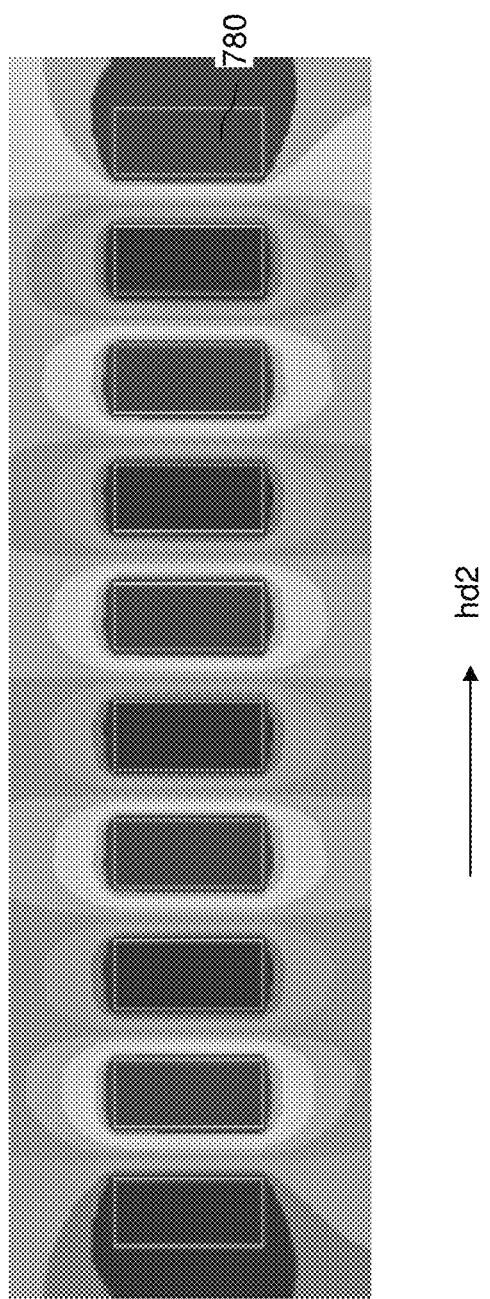
FIG. 5B is a simulated vertical cross-sectional profile of equipotential lines within a vertical plane that cuts through metal lines of a logic die when a bias voltage is applied across the first electrode and the second electrode of the capacitor structure of an embodiment of the present disclosure.
Figure 5C:
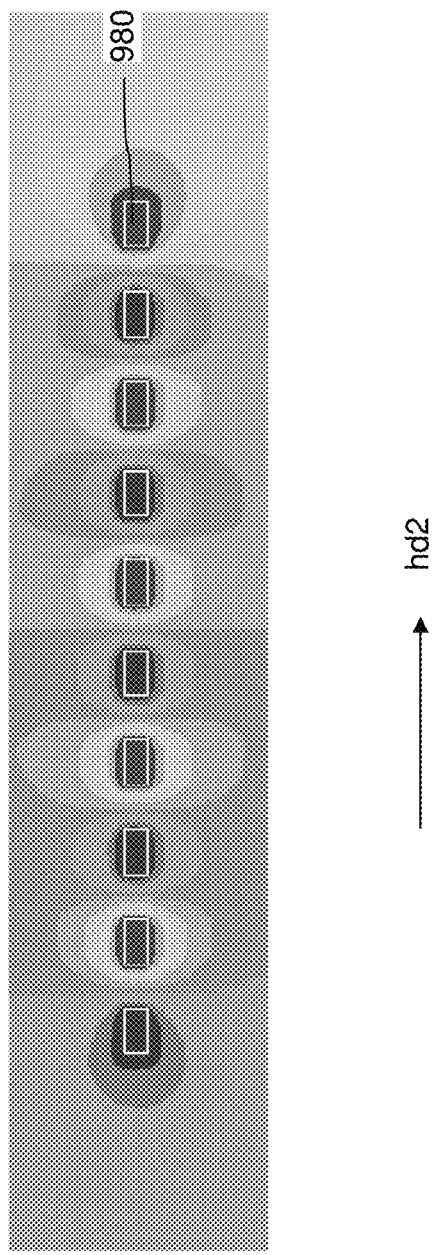
FIG. 5C is a simulated vertical cross-sectional profile of equipotential lines within a vertical plane that cuts through metal lines of a memory die when a bias voltage is applied across the first electrode and the second electrode of the capacitor structure of an embodiment of the present disclosure.

FIG. 5A illustrates a simulated horizontal cross-sectional profile of equipotential lines within a horizontal plane including the bonded pairs of first metal bonding pads 988 and second metal bonding pads 788 when a voltage is applied between the first electrode and the second electrode of the capacitor structure of an embodiment of the present disclosure. FIGS. 5B and 5C are simulated vertical cross-sectional profiles of equipotential lines within a vertical plane that cuts through metal lines of a logic die and a memory die, respectively, when a bias voltage is applied across the first electrode and the second electrode of the capacitor structure of an embodiment of the present disclosure. The embodiment capacitors provide an area savings in the logic die compared to forming the capacitors in other locations of the logic die 700.

During formation of the bonded assemblies of the embodiments of the present disclosure, the first semiconductor die 900 may be provided as a semiconductor die on a first wafer including a respective plurality of semiconductor dies, or may be provided as a singulated (i.e., diced) semiconductor die. Likewise, the second semiconductor die 700 may be provided as a semiconductor die on a second wafer including a respective plurality of semiconductor dies, or may be provided as a singulated semiconductor die.

Figure 6A:
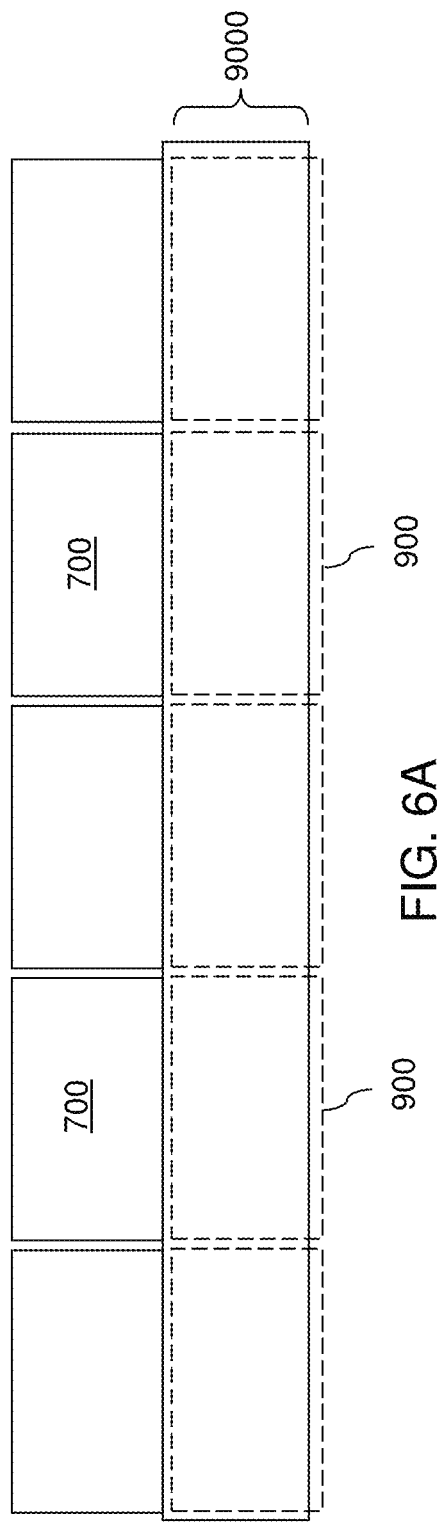
FIG. 6A illustrates a die-to-wafer bonding scheme that may be employed to form bonded assemblies of the present disclosure.

Referring to FIG. 6A, a die-to-wafer bonding scheme is illustrated, in which singulated second semiconductor dies 700 are bonded to a respective first semiconductor die 900 on a wafer 9000 including a plurality of first semiconductor dies 900. In one embodiment, the first semiconductor dies 900 comprise memory dies and the second semiconductor dies 700 comprise logic dies. In another embodiment, the first semiconductor dies 900 comprise logic dies and the second semiconductor dies 700 comprise memory dies.

Figure 6B:
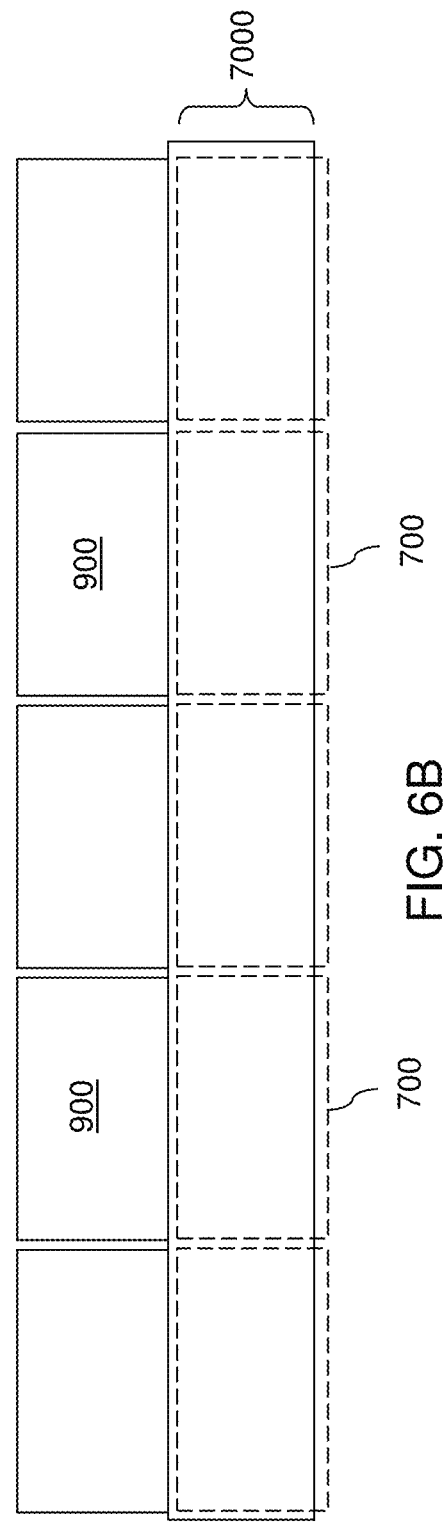
FIG. 6B illustrates another die-to-wafer bonding scheme that may be employed to form bonded assemblies of the present disclosure.

Referring to FIG. 6B, another die-to-wafer bonding scheme is illustrated, in which singulated first semiconductor dies 900 are bonded to a respective second semiconductor die 700 on a wafer 7000 including a plurality of second semiconductor dies 700. In one embodiment, the first semiconductor dies 900 comprise memory dies and the second semiconductor dies 700 comprise logic dies. In another embodiment, the first semiconductor dies 900 comprise logic dies and the second semiconductor dies 700 comprise memory dies.

Figure 7:
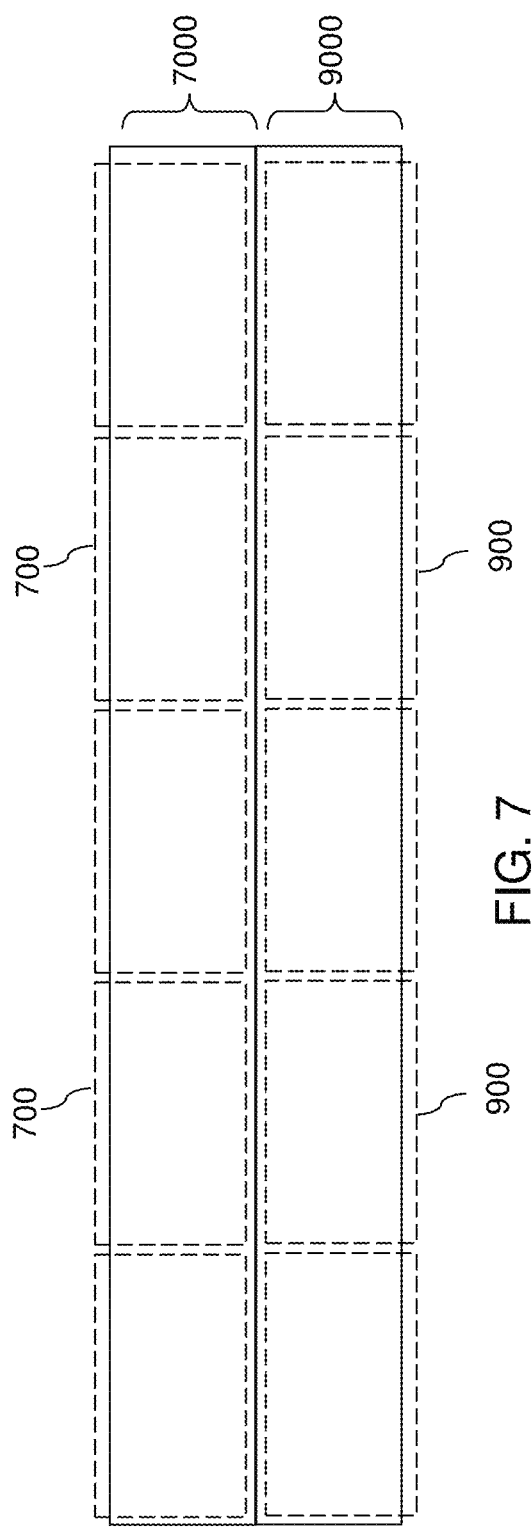
FIG. 7 illustrates a wafer-to-wafer bonding scheme that may be employed to form bonded assemblies of the present disclosure.

Referring to FIG. 7, a wafer-to-wafer bonding scheme is illustrated, in which each first semiconductor dies 900 on a first wafer 9000 including a plurality of first semiconductor dies 900 is bonded to a respective second semiconductor die 700 on a second wafer 7000 including a plurality of second semiconductor dies 700. In one embodiment, the first semiconductor dies 900 comprise memory dies and the second semiconductor dies 700 comprise logic dies. In another embodiment, the first semiconductor dies 900 comprise logic dies and the second semiconductor dies 700 comprise memory dies.

Figure 8:
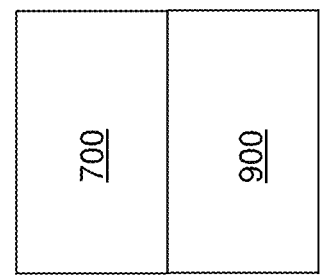
FIG. 8 illustrates a die-to-die bonding scheme that may be employed to form bonded assemblies of the present disclosure.

Referring to FIG. 8, a die-to-die bonding scheme is illustrated, in which a singulated first semiconductor die 900 is bonded to a singulated second semiconductor die 700. In one embodiment, the first semiconductor dies 900 comprise memory dies and the second semiconductor dies 700 comprise logic dies. In another embodiment, the first semiconductor dies 900 comprise logic dies and the second semiconductor dies 700 comprise memory dies.

Referring to all drawings and according to various embodiments of the present disclosure, a semiconductor structure is provided, which comprises: a bonded assembly of a first semiconductor die 900 including first metal bonding pads 988 and a second semiconductor die 700 including second metal bonding pads 788 that are bonded to the first metal bonding pads 988; and a capacitor structure comprising a first electrode, a second electrode, and a node dielectric disposed between the first electrode and the second electrode. The first electrode comprises first bonded pairs of a respective first metal bonding pad 988 of a first subset 98A of the first metal bonding pads 988 and a respective second metal bonding pad 788 of a first subset 78A of the second metal bonding pads 788. The second electrode comprises second bonded pairs of a respective first metal bonding pad 988 of a second subset 98B of the first metal bonding pads 988 and a respective second metal bonding pad 788 of a second subset 78B of the second metal bonding pads 788. The node dielectric comprises portions of a first bonding-level dielectric layer 968 laterally surrounding the first metal bonding pads 988 and disposed between laterally neighboring pairs of the first metal bonding pads 988 and portions of a second bonding-level dielectric layer 768 laterally surrounding the second metal bonding pads 788 and disposed between laterally neighboring pairs of the second metal bonding pads 788.

The capacitor structure of the embodiments of the present disclosure saves additional area in the logic die to form additional non-capacitor components, which improves the device area utilization in the logic die. The capacitor structure is used to store or release charge during operation of the semiconductor structure, such as during reading, programming and/or erasing of the memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
   a bonded assembly of a first semiconductor die including first metal bonding pads and a second semiconductor die including second metal bonding pads that are bonded to the first metal bonding pads; and
   a capacitor structure comprising a first electrode, a second electrode, and a node dielectric disposed between the first electrode and the second electrode,
   wherein:
   the first electrode comprises first bonded pairs of a respective first metal bonding pad of a first subset of the first metal bonding pads and a respective second metal bonding pad of a first subset of the second metal bonding pads;
   the second electrode comprises second bonded pairs of a respective first metal bonding pad of a second subset of the first metal bonding pads and a respective second metal bonding pad of a second subset of the second metal bonding pads;
   the node dielectric comprises portions of a first bonding-level dielectric layer laterally surrounding the first metal bonding pads and disposed between laterally neighboring pairs of the first metal bonding pads and portions of a second bonding-level dielectric layer laterally surrounding the second metal bonding pads and disposed between laterally neighboring pairs of the second metal bonding pads;
   the first subset of the first metal bonding pads, the first subset of the second metal bonding pads, the second subset of the first metal bonding pads, and the second subset of the second metal bonding pads comprise respective rows of metal bonding pads having a periodic pitch along a first horizontal direction and having a nearest-neighbor spacing within each row that is less than one half of the periodic pitch along the first horizontal direction; and
   the periodic pitch is in a range from 1,000 nm to 10,000 nm.

2. The semiconductor structure of claim 1, further comprising metal interconnect structures located in a first one of the first semiconductor die and the second semiconductor die and comprising:
   a first electrically conductive path that electrically connects the first electrode to a first node of semiconductor devices located within the first one of the first semiconductor die and the second semiconductor die; and
   a second electrically conductive path that electrically connects the second electrode to a second node of the semiconductor devices located within the first one of the first semiconductor die and the second semiconductor die.

3. The semiconductor structure of claim 2, wherein the first electrode and the second electrode do not contact any metal interconnect structure located within a second one of the first semiconductor die and the second semiconductor die.

4. The semiconductor structure of claim 1, wherein:
   the first bonded pairs are arranged as first rows of bonded pairs of a respective first metal bonding pad within the first subset of the first metal bonding pads and a respective second metal bonding pad within the first subset of the second metal bonding pads; and
   the second bonded pairs are arranged as second rows of bonded pairs of a respective first metal bonding pad within the second subset of the first metal bonding pads and a respective second metal bonding pad within the second subset of the second metal bonding pads.

5. The semiconductor structure of claim 4, wherein:
   each of the first rows of bonded pairs laterally extends along a first horizontal direction;
   each of the second rows of bonded pairs laterally extends along the first horizontal direction; and
   the first rows of bonded pairs and the second rows of bonded pairs are interlaced along a second horizontal direction that is perpendicular to the first horizontal direction such that the first rows and the second rows alternate along the second horizontal direction.

6. The semiconductor structure of claim 1, wherein:
   the first metal bonding pads and the second metal bonding pads comprise a metal element at an atomic percentage greater than 90%; and
   bonding interfaces are located between a respective one of the first metal bonding pads and a respective one of the second metal bonding pads; and
   grain boundaries protrude upward or downward through the bonding interfaces.

7. The semiconductor structure of claim 1, wherein:
   the first electrode comprises first metal lines located within a first one of the first semiconductor die and the second semiconductor die and electrically connected to the first bonded pairs; and
   the second electrode comprises second metal lines located within the first one of the first semiconductor die and the second semiconductor die and electrically connected to the second bonded pairs.

8. The semiconductor structure of claim 7, wherein:

the first semiconductor die comprises a memory die containing a three-dimensional array of memory elements; and the second semiconductor die comprises a logic die containing a peripheral circuit configured to control operation of the three-dimensional array of memory elements.

9. The semiconductor structure of claim 8, wherein:

the memory die further comprises bit lines located between the three-dimensional array of memory elements and a horizontal plane including bonding interfaces between the first semiconductor die and the second semiconductor die; and the first metal lines and the second metal lines are more proximal to the horizontal plane including the bonding interfaces than the bit lines are to the horizontal plane.

10. The semiconductor structure of claim 8, wherein:

the logic die comprises field effect transistors located on a surface of a logic-side semiconductor substrate; and the first metal lines and the second metal lines are more proximal to a horizontal plane including bonding interfaces between the first semiconductor die and the second semiconductor die than the field effect transistors are to the horizontal plane.

11. The semiconductor structure of claim 7, wherein:

the first metal lines laterally extend along a first horizontal direction;

the second metal lines laterally extend along the first horizontal direction; and the first metal lines and the second metal lines are interlaced along a second horizontal direction that is perpendicular to the first horizontal direction such that the first metal lines and the second metal lines alternate along the second horizontal direction.

12. The semiconductor structure of claim 11, wherein the first electrode further comprises a first bus metal line laterally extending along the second horizontal direction;

each of the first metal lines comprises a respective end portion connected to the first bus metal line;

the second electrode further comprises a second bus metal line laterally extending along the second horizontal direction; and each of the second metal lines comprises a respective end portion connected to the second bus metal line.

13. The semiconductor structure of claim 1, wherein:

a third subset of the first metal bonding pads is electrically isolated from the capacitor structure and is electrically connected to a respective node of first semiconductor devices located in the first semiconductor die;

a third subset of the second metal bonding pads is electrically isolated from the capacitor structure and is electrically connected to a respective node of second semiconductor devices located in the second semiconductor die; and the third subset of the second metal bonding pads is bonded to the third subset of the first metal bonding pads.

14. The semiconductor structure of claim 1, wherein:

the first semiconductor die comprises a first semiconductor substrate on which first semiconductor devices are located;

the second semiconductor die comprises a second semiconductor substrate on which second semiconductor devices are located; and the semiconductor structure further comprises:

a backside insulating layer located on a backside of one of the first semiconductor substrate and the second semiconductor substrate; and external bonding pads located on the backside insulating layer and electrically connected to a respective one of the first semiconductor devices and the second semiconductor devices.

\* \* \* \* \*